(12) United States Patent
Chang

(10) Patent No.: US 6,256,681 B1
(45) Date of Patent: Jul. 3, 2001

(54) DATA BUFFER FOR PROGRAMMABLE MEMORY

(75) Inventor: Seung-Ho Chang, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/185,088

(22) Filed: Nov. 3, 1998

(30) Foreign Application Priority Data

Jan. 20, 1998 (KR) .................................................. 98-1546

(51) Int. Cl.[7] ...................................................... G06F 3/00
(52) U.S. Cl. ................................. 710/1; 710/52; 711/154
(58) Field of Search ........................ 710/1, 52; 711/154; 365/191, 185.24, 238.5, 230.05

(56) References Cited

U.S. PATENT DOCUMENTS

| | | | |
|---|---|---|---|
| 4,463,443 | 7/1984 | Frankel et al. | 364/900 |
| 5,042,013 | * 8/1991 | Sato | 365/230.05 |
| 5,130,704 | * 7/1992 | Ogawa et al. | 345/204 |
| 5,170,157 | 12/1992 | Ishii | 340/799 |
| 5,297,029 | * 3/1994 | Nakai et al. | 365/238.5 |
| 5,559,736 | * 9/1996 | Matsukawa et al. | 365/185.24 |
| 6,101,135 | * 8/2000 | Lee | 365/191 |

* cited by examiner

*Primary Examiner*—Xuan M. Thai
(74) *Attorney, Agent, or Firm*—Fleshner & Kim, LLP

(57) ABSTRACT

A memory buffer and method are provided that interface input/output buffers and sense amplifiers of a multi-state programmable memory and sense amplifiers. The memory buffer includes switch circuits that are respectively placed between the input/output buffers and data register array and between the sense amplifiers and the data register array to read and write data in the memory regardless of volume and processing speed of the data. A controller controls the switch circuits to simultaneously operating the data transmission between the input/output buffers and the data buffer and between the sense amplifiers and the data buffer.

20 Claims, 5 Drawing Sheets

DATA BUFFER FOR PROGRAMMABLE MEMORY

BACKGROUND OF THE INVENTION

1. Field of the Invention

The present invention relates to a data buffer and method, and in particular, to a data buffer and method for using same that interfaces input/output buffers in a multi-state programmable memory.

2. Background of the Related Art

Generally, programmable memory devices such as a mass storage flash memory have less than 8 (i.e., 1 byte) input/output pins, and internally have dozens of sense amplifiers. The input/output pins transmit data by being synchronized to a clock signal, which has a clock cycle being dozens of nanoseconds (nsecs). The input/output buffer continuously transmits a predetermined volume of data according to the clock cycle or clock signal speed. However, a time for the sense amplifier to read data from flash memory cells is dozens of nsecs, and a time for the sense amplifier to write the data to the flash memory cells is hundreds of nsecs-dozens of microseconds ($\mu$secs). Thus, both the data reading and the data writing speed are slower than the data processing speed of the input/output pins. Accordingly, a data buffer is required to buffer differences of volume of data and of data transmission speed during the data reading and the data writing processes.

A capacity of the data buffer should be equal to a minimum volume of data that the data pins continuously receive. Generally, the minimum volume of received data is equal to data in a row of a memory. An access time of the data buffer should be faster than a data transmission time of the input/output buffer. The data buffer serves as an embedded memory provided in the programmable memory and mainly employs a latch array or a CMOS SRAM array, etc. therefor.

FIG. 1 is a circuit diagram of a related art data buffer for a multi-state programmable memory. As shown in FIG. 1, the related art data buffer for the multi-state programmable memory is provided with a cell array 1 having a plurality of columns, a plurality of sense amplifiers 2 that are respectively connected to a corresponding one of the columns of the cell array 1 and a plurality of data registers 3 each having a couple of inverters, for example INV3-1A, INV3-1B. The inverters INV3-1A and INV3-1B have inputs and outputs respectively connected to each other to latch a corresponding one of the sense amplifiers 2. An input/output buffer 4 is connected to each output of the data registers 3.

As described above, the related art data buffer has various disadvantages. When the construction of the sense amplifiers is simple, each column of the programmable memory can be connected to a corresponding one of the sense amplifiers 2. Thus, each of the sense amplifiers 2 is connected to a latch, which is a corresponding one of the data registers 3, to serve as the data buffer. However, if the size of each of the sense amplifiers is so large that each column can not be connected to the sense amplifiers, it is very difficult or impossible to array the latches. Also, the data buffer for the multi-state programmable memory should process data of at least 2 bits from the sense amplifiers. However, the related art data register has a problem processing the two or more bit data in a multi-state programmable memory.

The above references are incorporated by reference herein where appropriate for appropriate teachings of additional or alternative details, features and/or technical background.

SUMMARY OF THE INVENTION

An object of the present invention is to provide a data buffer and method that substantially obviates one or more problems are caused by limitations and disadvantages of the related art.

Another object of the present invention is to provide a data buffer that effectively processes data in a multi-state programmable memory regardless of volume and processing speed of the data and a method for using same.

Another object of the present invention is to provide a data buffer and method for a multi-state programmable memory that selectively couples data in a multi-state memory cell to input/output terminals.

To achieve at least these objects and other advantages in a whole or in parts and in accordance with the purpose of the present invention, as embodied and broadly described, a data buffer for a multi-state programmable memory includes a sense amplifier formed in a plurality of columns for temporarily storing data, a data register array configured as the number of input/output buffer pins, each array has rows corresponding to the number of cells to be processed by each sense amplifier, a plurality of upper read/write circuits connected between the data register array and the input/output buffers, a plurality of lower read/write circuits connected between the data register array and the sense amplifiers, an upper and a lower switch circuits for connecting the data register array to the upper read/write circuits and to the lower read/write circuits, respectively, and a decoder-having a plurality of outputs to select a plurality of wordlines of the data register array.

To further achieve the above objects in a whole or in parts, a method for accessing in a page mode data of a multi-state programmable memory having a matrix of memory cells, data of the memory cells being accessed using a buffer and a sense amplifier via a data register array storing a plurality of data pages, according to the present invention is provided that includes receiving data in a first page of the data register array from at least one of the buffer and the sense amplifier in a page mode and concurrently transmitting data from a second page of the data register array to at least one of the input/output buffer and the sense amplifier in the page mode.

To further achieve the above objects in a whole or in parts, a method for accessing a multi-state programmable memory using a data buffer according to the present invention is provided that includes writing data to a first page of a first data register array selected by a first switch circuit using a first read/write circuit at a sense amplifier clock speed, transmitting the data from the first page to a buffer selected by a second switch circuit using a second read/write circuit at a buffer clock speed and concurrently writing data to a second page of the register array selected by the first switch circuit using the first read/write circuit at the sense amplifier clock speed and transmitting the data from the second page selected by the second switch circuit to the buffer at the buffer clock speed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
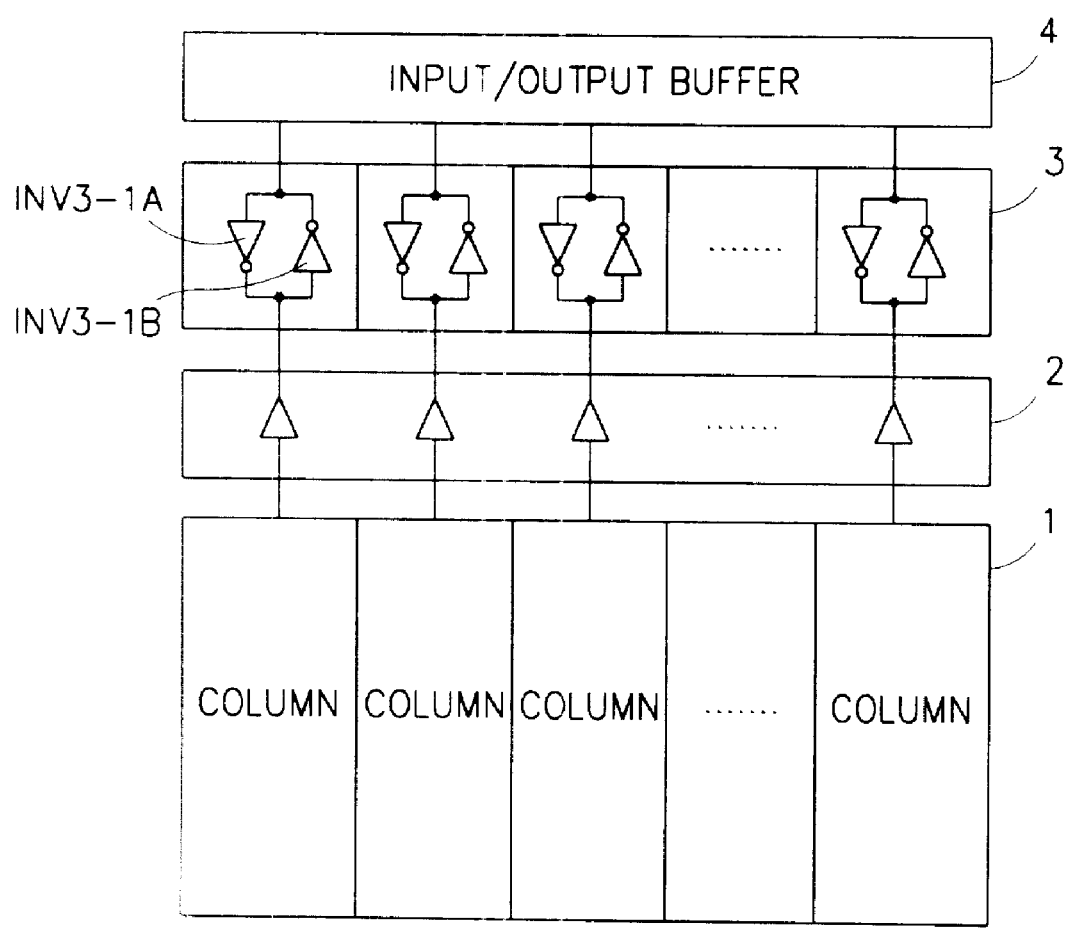
FIG. 1 a circuit diagram showing a related art data buffer for a multi-state programmable memory.
Figure 2:
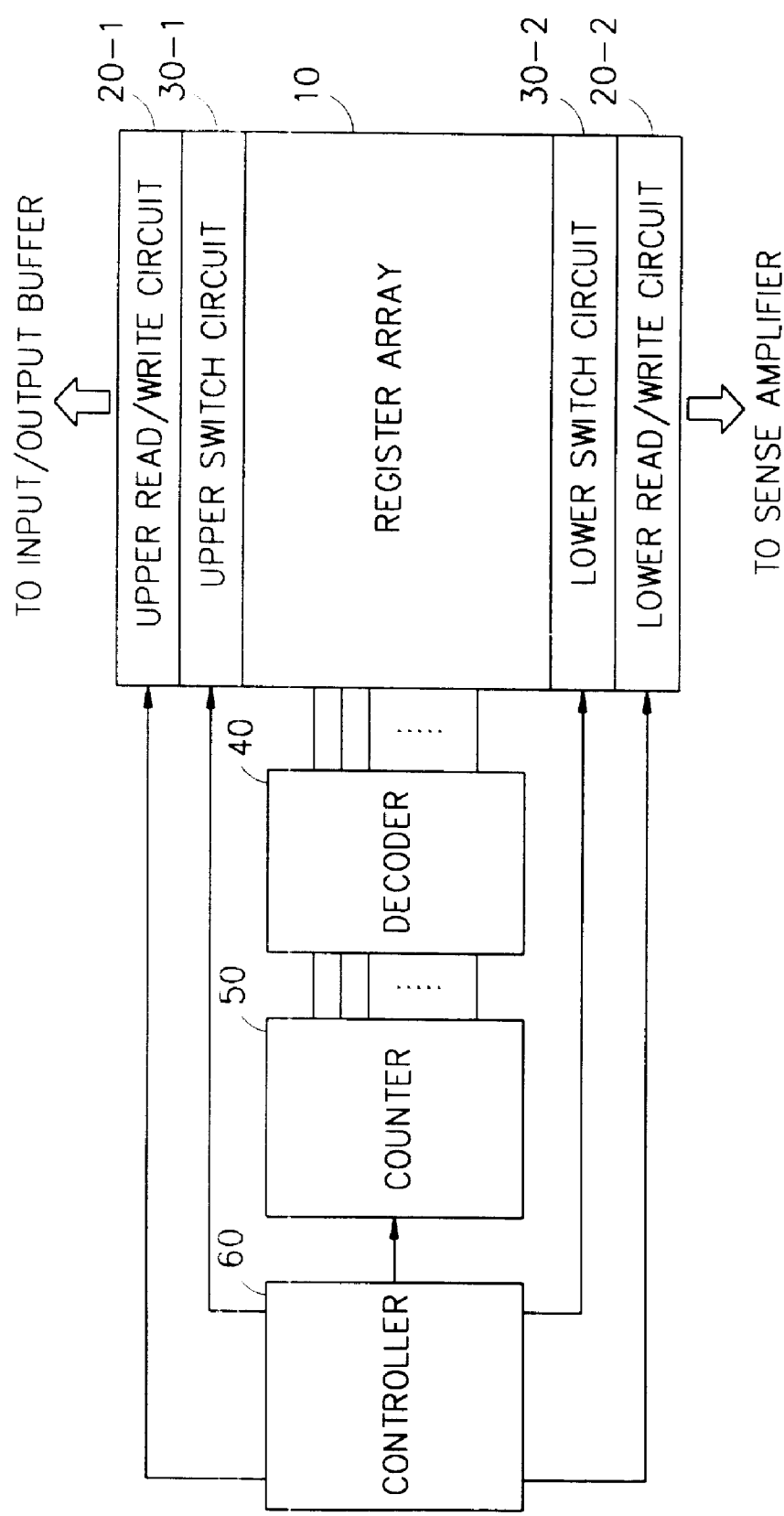
FIG. 2 is a circuit diagram showing a preferred embodiment of a data buffer for a multi-state programmable memory according to the present invention.

FIG. 2 is a circuit diagram showing a first preferred embodiment of a data buffer for a multi-state programmable memory according to the present invention. As shown in FIG. 2, the data buffer for the multi-state programmable memory includes a register array 10 for temporarily storing data to be processed by input/output buffers and sense amplifiers, a plurality of upper and a plurality of lower read/write circuits 20-1, 20-2 respectively coupled to the input/output buffers and the sense amplifiers for reading and writing the data, and an upper switch circuit 30-1 and a lower switch circuit, 30-2 for coupling the register array 10 to the upper and lower read/write circuits 20-1, 20-2, respectively. A decoder 40 drives wordlines of the register array 10. A counter 50 drives the decoder 40, and a controller 60 couples the counter 50 to various clocks to receive and transmit the data at an adequate speed. The controller 60 further selectively drives the upper and lower read/write circuits 20-1, 20-2.

Figure 3:
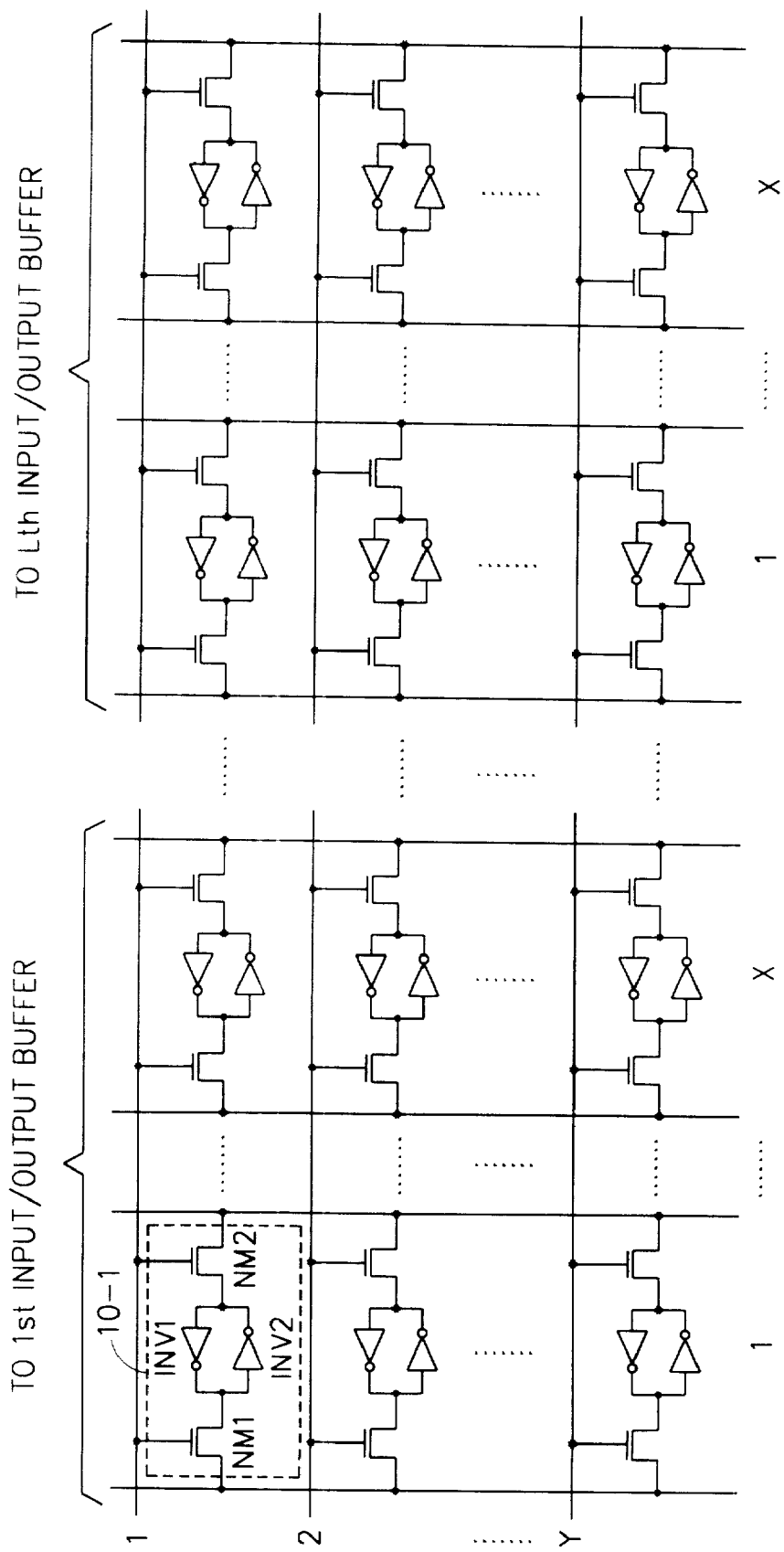
FIG. 3 is a circuit diagram showing an exemplary data register array of FIG. 2.

As shown in FIG. 3, the register array 10 includes a plurality of matrix-type (e.g., L*Y) data register cells (10-1). Each of the plurality of matrix-type data register cells 10-1 includes NMOS transistors NM1, NM2, respectively having a gate coupled to a wordline and a drain coupled to a bitline, and inverters INV1, INV2. The inverters INV1, INV2 have inputs and outputs coupled to each other and coupled between sources of the NMOS transistors NM1, NM2.

Operations of the first preferred embodiment of the data buffer for the multi-state programmable memory according to the present invention will now be described. The controller 60 supplies clock signals having different clock frequencies to the counter 50 in accordance with a data transmission mode to the input/output buffers and with a data transmission mode to the sense amplifiers. The controller 60 selects the upper and lower switch circuits by mode, to drive the upper and lower read/write circuits 20-1, 20-2. Each sense amplifier is coupled to a respective one of the read/write circuits 20-2, and an input/output of each sense amplifier is in accordance with the operation cycle of the sense amplifier. The read/write circuits 20-1 coupled to the input/output buffers are respectively synchronized with each operational clock signal and continuously input/output data by 1 bit.

The data register array 10 preferably reads data in a memory cell by three steps. First, the lower read/write circuit 20-2 writes data in accordance with a sensing speed of the sense amplifier to a first page of the register array 10 selected by the lower switch circuit 30-2. Second, the data written in the first step are transmitted from the first page, which is selected by the upper switch circuit 30-1, to the input/output buffer by being synchronized with a clock signal of the input/output buffer. Simultaneously, the lower read/write circuit 20-2 writes data in accordance with the sensing speed of the sense amplifier to a second page of the register array 10. Third, the data written in the second step are transmitted from the second page selected by the upper switch circuit 30-1 to the input/output buffer by being synchronized with a clock signal of the input/output buffer. In the second and third step, the data is continuously transmitted to the input/output buffer.

With these three steps, information in one row of the memory can be read, and the information in the entire memory can be read by repeating the above steps. Thus, data in multi-state programmable memory can be effectively read, regardless of volume and processing speed of data. A write mode, that is a program mode, operates in the opposite direction of the read mode of the register array 10.

Figure 4:
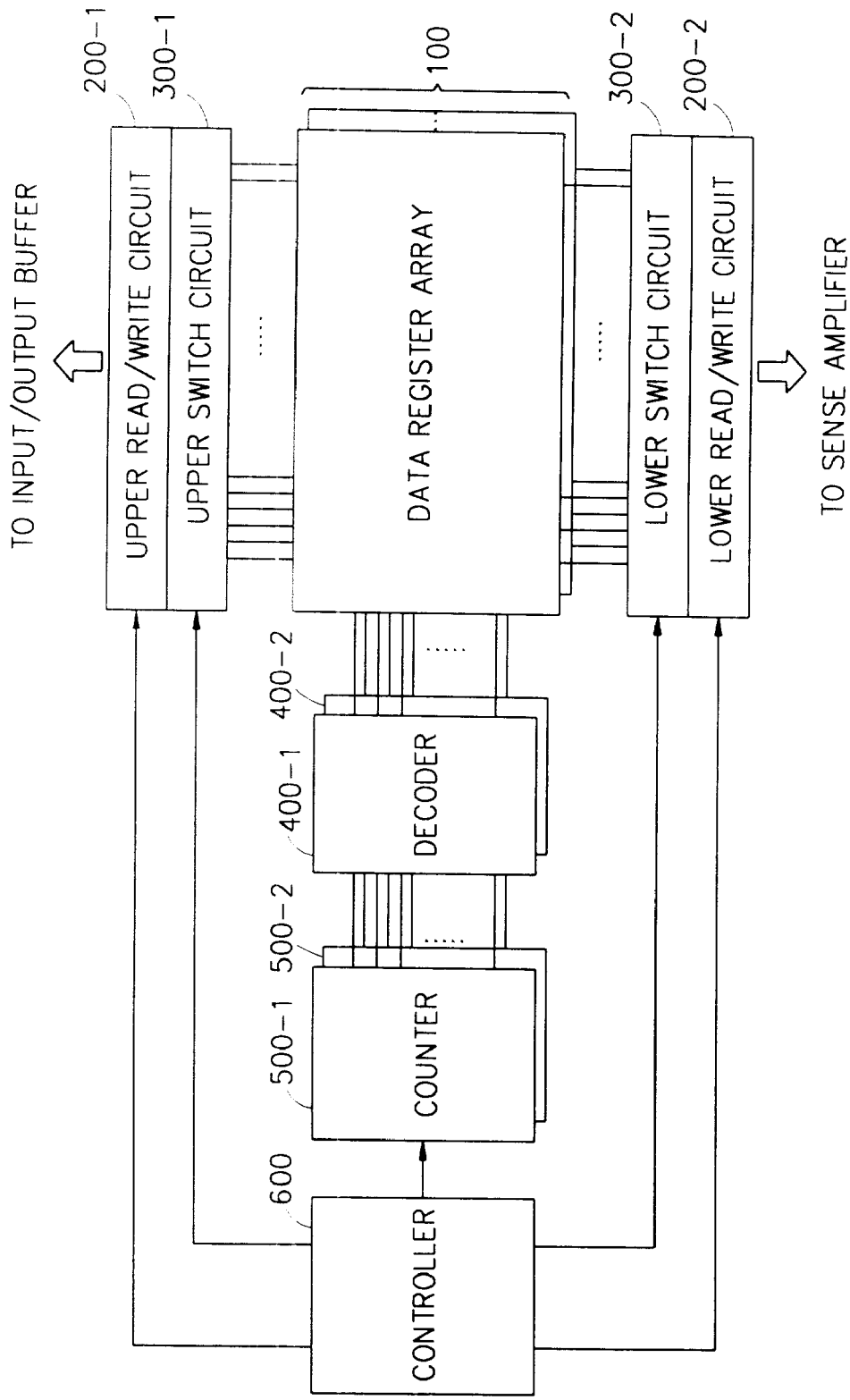
FIG. 4 is a circuit diagram showing another preferred embodiment of a data buffer for a multi-state programmable memory according to the present invention.

FIG. 4 is a circuit diagram showing a second preferred embodiment of a data buffer for a multi-state programmable memory according to the present invention. The second preferred embodiment of the data buffer for the multi-state programmable memory includes a plurality of data register arrays 100, read/write circuits 200-1, 200-2, switch circuits 300-1, 300-2, decoders 400 and counters 500.

As shown in FIG. 4, the plurality of data register arrays 100 each has a plurality of columns for temporarily storing data and rows to be processed by each sense amplifier, preferably formed as a number of pins of input/output buffers. A read/write circuit 200-1 is coupled between the data register arrays 100 and an input/output buffer. A read/write circuit 200-2 is coupled between the data register arrays 100 and the sense amplifiers. Upper and lower switch circuits 300-1, 300-2 respectively couple the data register arrays 100 to the read/write circuits 200-1, 200-2. The decoders 400-1, 400-2 drive corresponding wordlines of the data register arrays 100, and the counters 500-1, 500-2 drive the decoders 400-1, 400-2, respectively. The control circuit 600 drives the decoders 400-1, 400-2 by selecting two among clock signals and selectively coupling the data register arrays 100 to the read/write circuits 200-1, 200-2.

Figure 5:
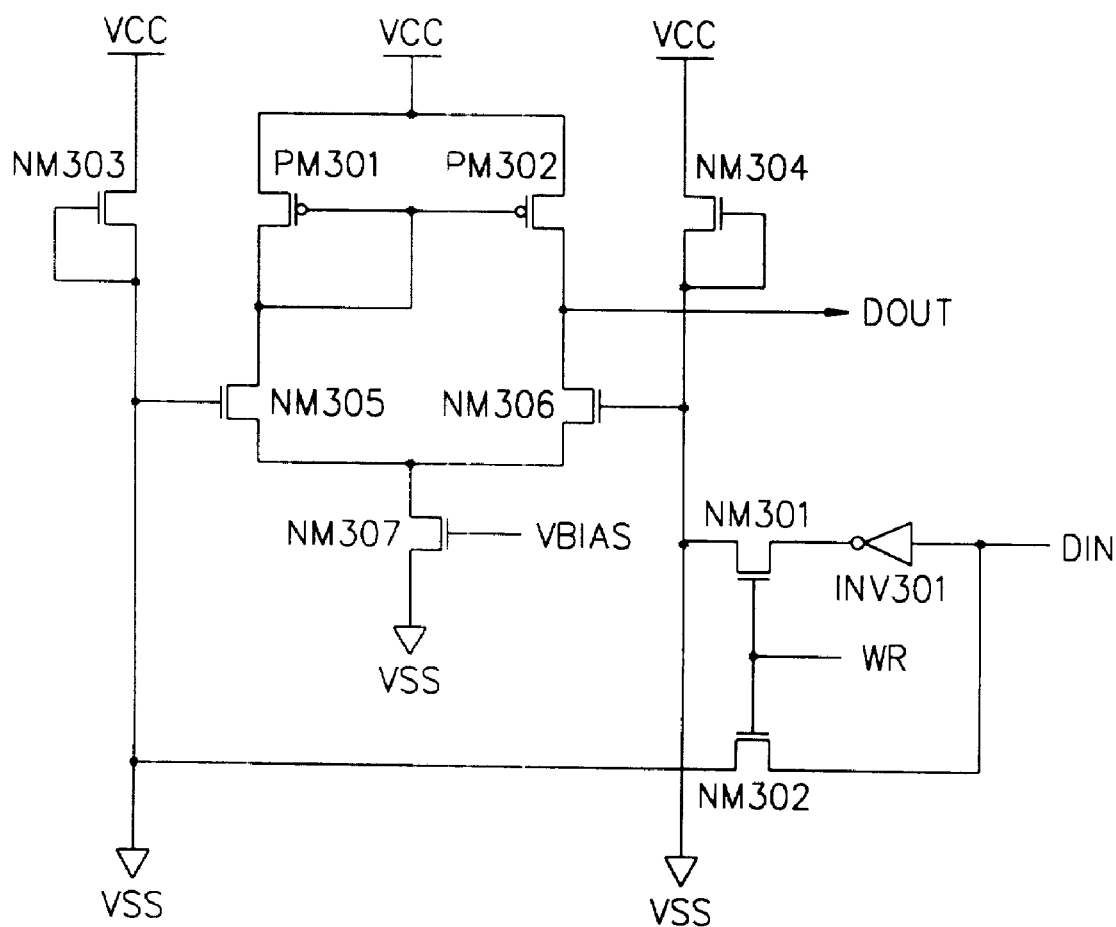
FIG. 5 is a diagram showing an exemplary read/write circuit of FIG. 4.

As shown in FIG. 5, each of the read/write circuits 200-1, 200-2 preferably includes an inverter INV301 for inverting an input data signal DIN and switch NMOS transistors NM301, NM302. The switch transistors NM301 and MN302 have gates that are commonly coupled, drains that are respectively coupled to a ground voltage VSS and sources that are respectively coupled to the inverter INV301 and the input data signal DIN. Register NMOS transistors NM303, NM304 each have a source and a gate coupled together, and a drain that receives an external voltage. Second and first PMOS transistors PM302, PM301 have sources that respectively receive an external voltage VCC and gates that are coupled together. A drain of the first PMOS transistor PM301 is coupled to the common gate. Mirror NMOS transistors NM305, NM306 have drains respectively coupled to the drains of the first and second PMOS transistors PM301, PM302, gates respectively coupled to the sources of the register NMOS transistors NM303, NM304 and sources coupled together. A bias NMOS transistor NM307 has a drain coupled to the common source of the mirror NMOS transistors NM305, NM306, a source coupled to the ground voltage VSS and a gate that receives a bias voltage VBIAS.

The data buffer according to the second preferred embodiment of the present invention simultaneously transmits and receives data to/from both sides of the input/output buffers and the sense amplifiers. Since the data register array is divided into two pages that are controlled by separate wordlines, one page transmits the data to the input/output buffers while the other page transmits the data to the sense amplifiers.

Therefore, the second preferred embodiment of a data buffer according to the present invention can interface the input/output buffers in the multi-state programmable memory that includes sense amplifiers, buffer the differences of the processing speed and the volume of data, and voluntarily read and write data in the data register array. Further, the second preferred embodiment of the data buffer enables simultaneous data transmission between the input/output buffers and the data buffer and data transmission between the sense amplifiers and the data buffer.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A data buffer for a semiconductor device, comprising:
    a buffer;
    a sense amplifier coupled to a memory having cells in a matrix form of rows and columns for reading and writing data to the memory;
    a first data register array coupled between the buffer and the sense amplifier, wherein the first data register array at least one of (1) stores second data received from the buffer into a second data region of the first data register and concurrently transmits stored first data from a first data region of the first data register array to the sense amplifier, and (2) stores fourth data received from the sense amplifier in the second data region and concurrently transmits stored third data from the first data region to the buffer, wherein the first and second data regions each have plurality of cells are arranged in a matrix form of rows and columns;
    a control circuitry coupled to the first data register array, the control circuitry dividing the first data register array into the first and second data register regions; and
    a first decoder circuit connected between the control circuitry and the first data register array that selects a corresponding row of the rows in each of the first and second data regions such that data is respectively read and written into the selected rows of data register cells in the corresponding first and second data regions.

2. The data buffer of claim 1, wherein the data is read from a first data page and written to a second data page.

3. The data buffer of claim 1, wherein previous data stored by the sense amplifier is read from a first data page by the buffer, and wherein current data is stored by the sense amplifier to a second data page.

4. The data buffer of claim 1, further comprising a second data register array and a second decoder.

5. The data buffer of claim 1, wherein the control circuitry comprises:
    a first read/write circuit connected to the buffer;
    a first switch circuit connected between the first read/write circuit and the first data register array;
    a second read/write circuit connected to the sense amplifier; and
    a second switch circuit connected between the first data register array and the second read/write circuit.

6. The data buffer of claim 5, wherein the second read/write circuit operates with a sense amplifier clock speed and the first read/write circuit operates at a buffer clock speed.

7. The data buffer of claim 5, wherein each read/write circuit comprises:
    a logic-gate that logically processes an input data signal;
    a first pair of switch transistors coupled to the logic-gate and the input data signal, respectively;
    a pair of register transistors receiving a first prescribed voltage that are respectively coupled to the first pair of switch transistors;
    a second pair of switch transistors coupled to the first prescribed voltage;
    a pair of mirror transistors having control electrodes respectively coupled to the register transistors, second electrodes respectively coupled to the second switch transistors, and first electrodes coupled together at a node; and
    a bias transistor coupled to the node and having a control electrode that receives a bias voltage.

8. The data buffer of claim 5, wherein each read/write circuit comprises:
    a logic-gate that logically processes an input data signal;
    a first pair of transistors having control electrodes that are commonly connected to a control signal, second electrodes respectively connected to a first prescribed voltage, and first electrodes connected to said logic-gate and said input data signal, respectively;
    a second pair of transistors each of which has a control and first electrode connected together and to the first prescribed voltage, and a second electrode that receives a second prescribed voltage;
    a third pair of transistors having first electrodes that respectively receive the second prescribed voltage and control electrodes that are connected together, and wherein a second electrode of the third pair of transistors is coupled to the commonly coupled control electrodes;
    a fourth pair of transistors having second electrodes respectively connected to the second electrodes of the third pair of transistors, and control electrodes that connected to the first electrodes of the second pair of transistors, respectively, and first electrodes connected to each other; and
    a bias transistor having a second electrodes connected to the common first electrodes of the fourth pair transistors, a first electrode connected to the first prescribed voltage and a control electrode that receives a bias voltage.

9. The data buffer of claim 1, wherein said each of the data register cells comprises:
    first and second transistors, respectively having a control electrode coupled to a wordline and a second electrode coupled to a bitline; and
    first and second logic gates having inputs and outputs coupled together and to corresponding ones of first electrodes of the first and second transistors.

10. The data buffer of claim 1, wherein the first data register array has a plurality of wordlines corresponding to the rows, wherein the first decoder has a plurality of outputs corresponding to the wordlines to select the selected row.

11. A method for accessing a multi-state programmable memory using a data buffer, wherein the data buffer has a prescribed number of I/O terminals and where the programmable memory includes a cell array having a matrix form of memory cells at intersections where wordlines cross bitlines a wordline driver coupled to the wordlines, and a decoder coupled to the bitlines, comprising:

connecting the data buffer to a first read/write circuit;

connecting the first read/write circuit to a first switch circuit;

selectively connecting the first switch circuit to a first data register array that includes a first and second data pages each having cell array with a matrix form of rows and columns;

selectively connecting a second switch circuit to the first data register array;

connecting a second read/write circuit to the second switch circuit;

connecting an array of sense amplifiers to the second read/write circuit;

connecting the bitlines of the cell array to corresponding ones of the sense amplifiers;

connecting a first decoder circuit to the first data register array;

writing data received from the cell array to a first page of the first data register array selected by the second switch circuit using the second read/write circuit at a sense amplifier clock speed;

transmitting the data from the first page to the data buffer selected by the first switch circuit using the first read/write circuit at a buffer clock speed and concurrently writing data to a second page of the first data register array selected by the second switch circuit using the second read/write circuit at the sense amplifier clock speed; and outputting the data from the second page selected by the first switch circuit to the buffer at the buffer clock speed.

12. The method of claim 11, wherein the memory comprises a second data register array, wherein the first data page is in the first data register array and the second data page is in the second data register array.

13. The method of claim 11, further comprising:

writing data received from the buffer to the first page of the first data register array selected by the first switch circuit using the first read/write circuit at a buffer clock speed;

transmitting the data from the data from the first page to the sense amplifier selected by the second switch circuit using the second read/write circuit at a sense amplifier clock speed to the sense amplifiers for transmission to the cell array and concurrently writing data to the second page of the first data register array selected by the first switch circuit using the first read/write circuit at the buffer clock speed; and writing the data from the second page selected by the second switch circuit using the second read/write circuit to the sense amplifier, at the sense amplifier speed.

14. The method of claim 11, wherein the data are temporarily stored in the first page and second page, and wherein the transmitting is repeatedly performed by alternating selection by the first and second switches, respectively, of the first and second pages.

15. The method of claim 13, wherein the data are temporarily stored in the first page and second page, and wherein the transmitting is repeatedly performed by alternating selection by the first and second switches, respectively, of the first and second pages.

16. A data buffer for a semiconductor device, comprising:

an input/output buffer;

a first read/write circuit connected to the buffer;

a first switch circuit connected to the first read/write circuit;

a first data register array connected to first switch circuit, wherein the first data register array is arranged in a matrix form of rows and columns;

a second switch circuit connected to the first data register array;

a second read/write circuit connected to the second switch circuit;

a sense amplifier that includes a plurality of sensing amplifiers each coupled to a corresponding bitline;

a memory array connected to the sense amplifier array that comprises,
a cell array having a matrix form of memory cells at intersections where wordlines cross the bitlines,
a wordline driver coupled to the wordlines, and
a bitline decoder coupled to the bitlines;

a first decoder circuit coupled to the first data register array that selects a corresponding row such that data is read and written into the selected row of data register cells in a corresponding data region; and a controller coupled to the decoder, the read/write circuits and the switches, wherein in a first mode of operation, data from the buffer is alternately stored in first and second regions of the first data register array at a buffer clock speed and concurrently the data is alternately output from the second and first regions, respectively, of the first data register at a sense amplifier clock speed.

17. The data buffer of claim 16, wherein in a second mode of operation, data from the memory array is alternately stored in the first and second regions, respectively, at the sense amplifier speed, and concurrently the data is alternately output from the second and first regions, respectively, at the data buffer clock speed.

18. The data buffer of claim 17, wherein the second read/write circuit operates with the sense amplifier clock speed and the first read/write circuit operates at the buffer clock speed.

19. The data buffer of claim 16, wherein each read/write circuit comprises:

a first pair of transistors having control electrodes that are commonly connected to a control signal, second electrodes respectively connected to a first prescribed voltage, and first electrodes connected to said input data signal, respectively;

a second pair of transistors each of which has a control and first electrode connected together and to the first prescribed voltage, and a second electrode that receives a second prescribed voltage;

a third pair of transistors having first electrodes that respectively receive the second prescribed voltage and control electrodes that are connected together, and wherein a second electrode of the third pair of transistors is coupled to the commonly coupled control electrodes;

a fourth pair of transistors having second electrodes respectively connected to the second electrodes of the third pair of transistors, and control electrodes that connected to the first electrodes of the second pair of transistors, respectively, and first electrodes connected to each other; and a bias transistor having a second electrodes connected to the common first electrodes of the fourth pair transistors, a first electrode connected to the first prescribed voltage and a control electrode that receives a bias voltage.

20. A read/write circuit for a data buffer comprising:

a logic-gate that logically processes an input data signal;

a first pair of transistors having control electrodes that are commonly connected to a control signal, second electrodes respectively connected to a first prescribed voltage, and first electrodes connected to said logic-gate and said input data signal, respectively;

a second pair of transistors each of which has a control and first electrode connected together and to the first prescribed voltage, and a second electrode that receives a second prescribed voltage;

a third pair of transistors having first electrodes that respectively receive the second prescribed voltage and control electrodes that are connected together, and wherein a second electrode of the third pair of transistors is coupled to the commonly coupled control electrodes;

a fourth pair of transistors having second electrodes respectively connected to the second electrodes of the third pair of transistors, and control electrodes that connected to the first electrodes of the second pair of transistors, respectively, and first electrodes connected to each other; and a bias transistor having a second electrodes connected to the common first electrodes of the fourth pair transistors, a first electrode connected to the first prescribed voltage and a control electrode that receives a bias voltage.

* * * * *